United States Patent [19]

Zach

[11] 4,456,163
[45] Jun. 26, 1984

[54] MULTI-FACED SOLDER POT

[75] Inventor: Hubert Zach, Berlin, Fed. Rep. of Germany

[73] Assignee: Micro Electronic Systems Inc., Danbury, Conn.

[21] Appl. No.: 314,420

[22] Filed: Oct. 23, 1981

[51] Int. Cl.³ .............................................. B23K 3/00
[52] U.S. Cl. ........................................ 228/56; 228/19
[58] Field of Search ................... 228/56, 19, 51, 264, 228/180 R

[56] References Cited

U.S. PATENT DOCUMENTS

| 3,557,430 | 1/1971 | Jones | 228/19 |
|---|---|---|---|
| 3,731,866 | 5/1973 | Mason et al. | 228/19 X |
| 3,815,806 | 6/1974 | Paxton | 228/56 X |
| 4,034,202 | 7/1977 | Vandermark | 228/19 X |

FOREIGN PATENT DOCUMENTS

| 2119402 | 10/1972 | Fed. Rep. of Germany | 228/19 |
|---|---|---|---|
| 138862 | 11/1979 | German Democratic Rep. | 228/19 |
| 46-34215 | 10/1971 | Japan | 228/56 |
| 2063135 | 6/1981 | United Kingdom | 228/19 |

OTHER PUBLICATIONS

"De-Soldering Device", by Babuka, IBM Technical Disclosure Bulletin, vol. 13, No. 3, Aug. 1970, p. 713.

Primary Examiner—Kuang Y. Lin
Attorney, Agent, or Firm—Mattern, Ware, Stoltz & Fressola

[57] ABSTRACT

By providing a multi-faced, heat conducting element incorporating projecting heat insulating material in juxtaposed, spaced relationship to the heat conducting element, a unique, inexpensive, readily produced solder pot is achieved for use in removing and replacing multi-pinned components mounted on printed circuit boards. In the preferred embodiment, the multi-faced heat conducting element incorporates a plurality of different faces, with each face corresponding to the pin configuration of a particular multi-pinned component, thereby achieving a single solder pot which can be employed for a plurality of different multi-pinned components. Furthermore, the preferred embodiment incorporates the heat insulating material formed as side panels, mounted at each end of the multi-faced element, with the heat insulating material possessing overall dimensions which expand upon heating to become greater than the outer dimensions of the multi-faced element. In this way, the solder pot of the present invention assures that the heat insulating material extends beyond the heat conducting element during use, and contact between the heated element and the printed circuit board is eliminated.

9 Claims, 7 Drawing Figures

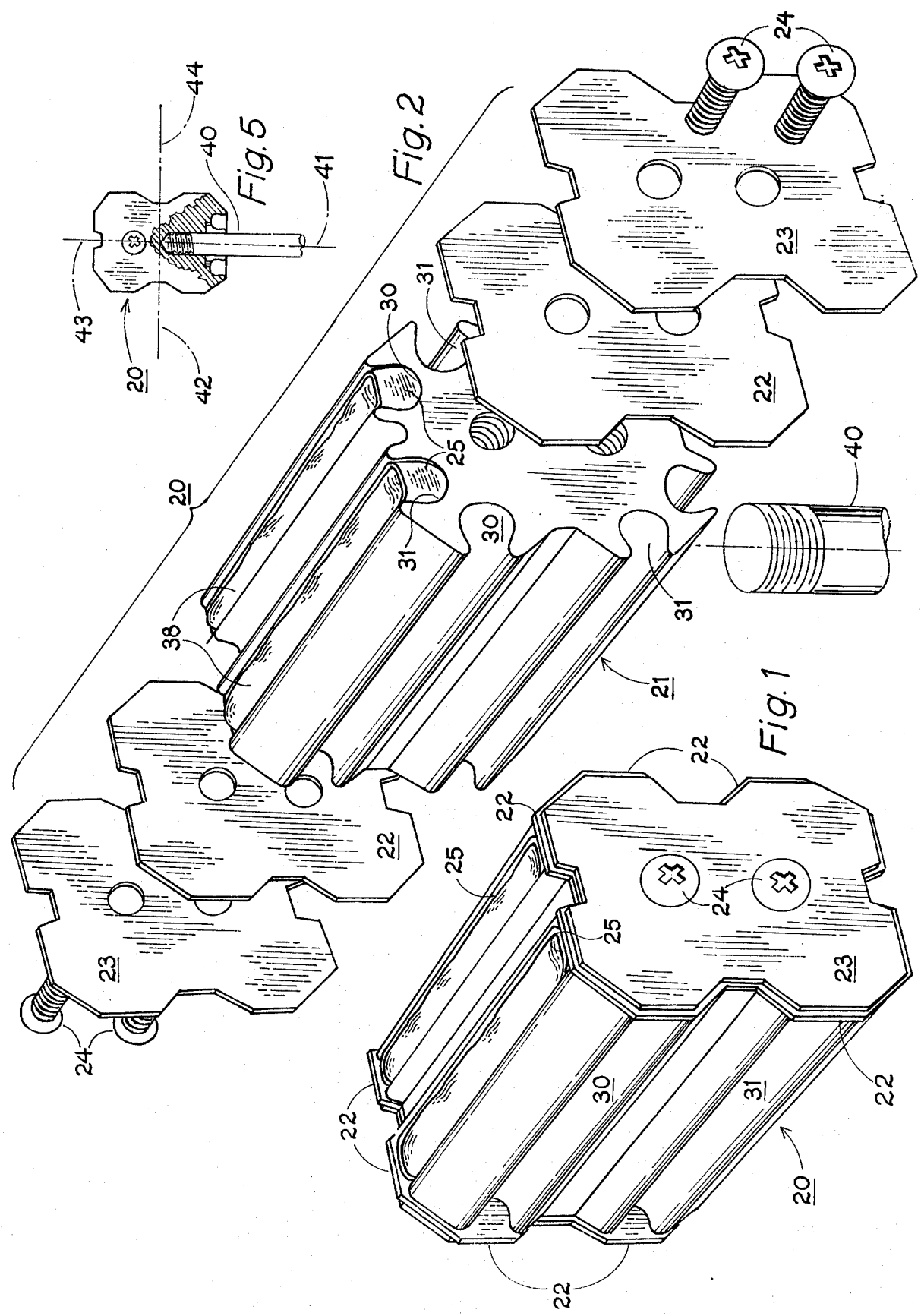

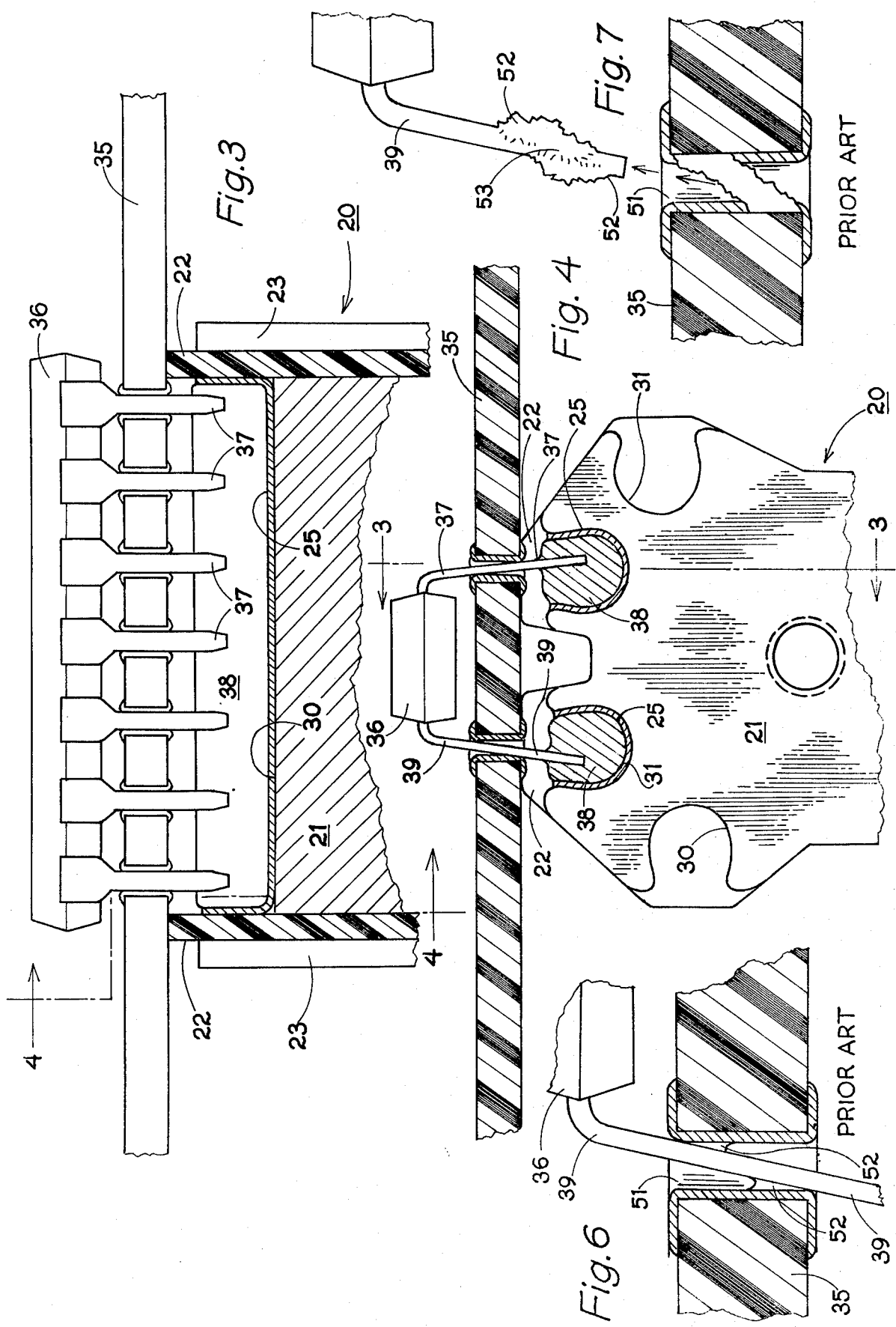

MULTI-FACED SOLDER POT

TECHNICAL FIELD

This invention relates to solder pots and more particularly to solder pots for removing and replacing multi-pinned components mounted to printed circuit boards, working from the underside of the printed circuit board.

BACKGROUND ART

With the ever increasing use of multi-pinned components soldered on printed circuit boards, the need for specialized tools for installing and removing these multi-pinned components has become increasingly important. As a result, various devices have been created in an attempt to meet industry's needs. However, these prior art devices have failed to achieve an inexpensive, easily used multi-purpose tool.

The major failures of the prior art devices are that they are cumbersome, expensive, and have very limited capabilities. In addition, the prior art devices cannot be employed quickly and easily.

In general, component removal systems operate on either the underside of the PC board or on the component side. Many prior art devices have been developed for removal of the multi-pinned components by direct extraction of the component from the printed circuit board by gripping the component itself, after heating the upper ends of the component's terminal leads from above the PC board. Such systems are extremely undesirable since they may damage the component being removed, through overheating, and can also damage the printed circuit board or its connections.

So called "soldier-sucker" prior art devices which operate on the underside of the PC board have not eliminated the problem of damaging the board during removal of the component, and these prior art devices are incapable of removing enough solder from the connections to assure undamaged PC boards. Two separate heating steps, for unsoldering an old component and resoldering a new component, cause double the risk of heat-shock damage to the PC board. As a result, these devices have failed to satisfy the industry's needs.

Therefore, it is a principal object of the present invention to provide a simple, efficient solder pot capable of providing rapid desoldering of a multi-pinned component, to allow its quick removal from a printed circuit board, and to provide rapid soldering of a replacement component, while preserving the PC board intact and undamaged.

A further object of the invention is to provide a solder pot capable of supporting a printed circuit board in heat-insulated juxtaposition while supplying heat to the exposed ends of a component's terminal leads, releasing the component for removal, replacement and resoldering in a single heating operation.

Another object of the present invention is to provide a multi-faced solder pot having the characteristic features described above, which is inexpensive to manufacture, is cost efficient, and is simple to operate.

Another object of the present invention is to provide a multi-faced solder pot having the characteristic features defined above which prevents unwanted contact of the heating element with the printed circuit board and assures that no damage or degradation of the printed circuit board results.

Another object of the present invention is to provide a multi-faced solder pot having the characteristic features defined above which is capable of being employed for removing and replacing a plurality of different multi-pinned components.

Other and more specific objects will in part be obvious and will in part appear hereinafter.

DISCLOSURE OF THE INVENTION

The present invention overcomes the deficiencies and problems encountered with prior art solder pots by providing a heating element having multiple-faces, with each face being dimensioned to correspond to the pin position and alignment of different conventional multi-pinned component for desoldering of the component multi-faced heat conducting element of the present invention is designed for removing and replacing dual-in-line multi-pinned components, with each face of the multi-faced element comprising two elongated parallel solder-holding troughs, which are spaced apart a distance equal to the spacing between the rows of terminal pins on conventional dual-in-line, multi-pinned package components or "DIPs".

In addition, heat insulating spacers are securely mounted to the multi-faced heating elements, with the spacers establishing a PC board contact surface which is spaced away from the heated surface of the multi-faced element. In this way, the heat insulating member provides foolproof assurance that the only contact between the solder pot and the printed circuit board will be along the heat insulating member. Consequently, the solder pot of the present invention assures that the heating element will contact only the pins of the multi-pinned component and unwanted contact of the heating element directly with the printed circuit board is prevented.

As is readily apparent, the solder pot of the present invention provides quick and easy heating of the multi-pinned component for desoldering of the component from the board, as well as providing quick and easy resoldering of a new or replacement component. Speed and operation ease are provided, while also assuring that no damage to the printed circuit board results.

The invention accordingly comprises a product possessing the features, properties, and the relation of components which will be exemplified in the product hereinafter described, and the scope of the invention will be indicated in the claims.

BRIEF DESCRIPTION OF THE DRAWINGS

For a fuller understanding of the nature and objects of the invention, reference should be had to the following detailed description taken in connection with the accompanying drawings, in which:

FIG. 1 is an end perspective view of the fully assembled solder pot of the present invention;

FIG. 2 is a partially exploded end perspective view of the solder pot of FIG. 1;

FIG. 3 is a fragmentary enlarged elevation view, partially in cross section and partially broken away, taken along line 3—3 of FIG. 4 showing the solder pot of the present invention in use heating a DIP mounted to a printed circuit board;

FIG. 4 is a corresponding fragmentary enlarged end view, partially in cross section, taken along line 4—4 of FIG. 3, showing the solder pot of the present invention in use heating a DIP mounted to a printed circuit board;

FIG. 5 is an end elevation view, partially broken away to show the assembly of the solder pot on its heat-conducting support rod;

FIG. 6 is a greatly enlarged fragmentary cross sectional end elevation view showing a DIP terminal lead installed in a plated hole in a circuit board, in the process of conventional solder removal; and FIG. 7 is a corresponding greatly enlarged view of the same DIP terminal withdrawn after solder removal, showing damage to the plated hole portion of the circuit board resulting from such conventional prior art techniques.

BEST MODE FOR CARRYING OUT THE INVENTION

In FIG. 1, the preferred embodiment of the multi-faced, heat conducting solder pot 20 of the present invention is shown fully assembled, and FIG. 2 clearly shows each of the components forming assembled solder pot 20. By referring to FIGS. 1 and 2, it can be readily understood that solder pot 20 incorporates a multi-faced, heat conducting head 21, heat insulating end members 22 and end plates 23 mounted to heat insulating end members 22 in order to maintain the heat insulating members 22 in position and protect the surfaces thereof. Heat insulating end members 22 and end plates 23 are securely mounted to multi-faced heat conducting head 21 by fastening means 24.

As best seen in FIG. 2, multi-faced, heat conducting head 21 comprises four faces spaced about the outer peripheral surface at substantially 90 degrees to each other and incorporates two elongated channels or troughs 30 and 31 recessed in each face thereof, with channels 30 and 31 extending the entire length of head 21, while also being substantially parallel to each other. Preferably, solder holding tubs 25 are mounted in channels 30 and 31 of the particular face which is to be employed for removing the desired component.

Head 21 is conveniently fabricated of aluminum by standard extrusion techniques, and diffusion of aluminum traces into molten solder in troughs 30 and 31 is prevented by forming tubs 25 of relatively inert and high melting temperature metal, such as iron.

Elongated channels 30 and 31 are spaced apart a pre-set distance on each face of head 21, with this pre-set distance being different for each of the faces of head 21. Since elongated channels 30 and 31 are both constructed to contain independent solder tubs 25, which solder is to be employed for heating the pins on each side of the multi-pinned component, the distance between elongated channels 30 and 31 on each face of head 21 is established by the distance between the spaced rows of pins of the particular component.

In order to reduce manufacturing expenses and increase the universality of each solder pot of the present invention, each face of head 21 is constructed with longitudinally extending channels 30 and 31 being spaced apart a different distance. In this way, each face of head 21 is specifically constructed for desoldering and resoldering multi-pinned components having a specific predetermined terminal pin row spacing.

For purposes of convenience and ease of explanation and disclosure, the multi-pinned component shown in the drawings is depicted as a multi-pinned, dual-in-line package component commonly referred to as a "DIP". However, as is readily apparent to one having ordinary skill in the art, the solder pot of the present invention may be constructed for removal and replacement of any multi-pinned component, such as connectors, relays, square packs, etc. The only requirement for employing the solder pot of the present invention with any multi-pinned component configuration is the need to construct one of the faces of the multi-faced heating head with a channel configuration conforming to the requisite dimensions of the desired multi-pinned component. Consequently, all showings in the drawings and all references in the detailed disclosure of the use of the solder pot of the present invention with DIPs is for illustrative purposes only, and should not be considered as a limitation.

In the preferred construction, the solder pot of the present invention employs an aluminum extrusion as heating element head 21. By manufacturing head 21 as an extrusion, the necessary dimensional tolerances for channels 30 and 31 on each of the faces of head 21 are easily maintained. In addition, an extrusion provides an inexpensive, readily manufactured construction.

Furthermore, since DIP configurations have been found to vary in overall length more frequently than in the distance between the rows of pins, the use of an aluminum extrusion as the heating head 21 of solder pot 20 of the present invention also allows the extrusion to be formed in greatly elongated lengths, which are then cut to any desired head length. Consequently, a configuration for various lengths of DIPs can be made quickly and easily by merely cutting the overall extrusion at different desired lengths. In this way, quality control is maintained while manufacturing expenses are minimized.

As shown in FIGS. 1 and 2, the preferred embodiment of insulating member 22 comprises a sheet of heat insulating material having overall outer dimensions which match the outer dimensions of head 21. This material expands upon heating, and defines a PC board-supporting surface spaced above the heated solder pot head. This assures that no portion of heated, multi-faced head 21 will contact the printed circuit board. It has been found that a sheet of DuPont "Teflon" fluoro-carbon resin, such as polytetrafluoroethylene, or fluorinated ethylene-propylene, provides the desired heat insulating characteristics and assures that the printed circuit board is free from direct or indirect heating contact. However, any other suitable heat insulating material can be employed in order to achieve the desired result.

In addition, as will be apparent to those having ordinary skill in the art, the construction depicted in the drawings for heating insulating material 22, and discussed in this detailed specification, is also intended to be illustrative and not a limitation. As is readily apparent, many alternate constructions can be employed to provide a heat insulating member which is in juxtaposed spaced relationship to multi-faced heating head 21, with the heat insulating member extending from the heated, multi-faced head in spaced relationship thereto (1) to contact a printed circuit board before any contact of the printed circuit board with the heated head could occur, and (2) to maintain the printed circuit board at the desired spaced distance from the heated head. Consequently, any heat insulating member designed to prevent any heat-conducting contact of the printed circuit board with the heated, multi-faced head is within the scope of the present invention.

Before discussing the actual use and method of operation for employing solder pot 20 of the present invention, it is readily apparent that multi-faced head 21 of solder pot 20 must be heated to raise the solder in solder tubs 25 to the desired temperature for achieving the desired results. As shown in FIGS. 1 and 2, head 21 is heated using a conventional heat conducting rod 40 well known in the art. However, depending upon the particular system desired, heating rod 40 can be mounted to solder pot 20 in various alternate positions, such as the four radial axes 41, 42, 43 and 44 shown in FIG. 5.

If each face of multi-faced head 21 is to be employed for desoldering and resoldering various different multi-pinned components, heating rod 40 can be attached to one end of head 21 by passing heating rod 40 through at least one side plate 23 and teflon insulating plate 22, directly into an appropriately accomodating recess formed in the end surface of head 21.

Alternatively, if only one particular type of multi-pinned component is to be removed and replaced, thereby requiring only one face of head 21 is to be employed, the heating rod 40 is preferably mounted directly into head 21 through the face opposite the desired face. In this way, the desired face configuration is the top face of head 21 and faces upwardly, thereby providing the operator with ease of use and optimum convenience, with head 21 directly overlying the heater unit, surmounting a vertical rod 40 as shown in FIG. 5.

By referring to FIGS. 3 and 4, the use and method of operation for employing solder pot 20 of the present invention can best be understood. As shown therein, DIP 36 is soldered to printed circuit board 35 so that pins 37 and 39 of DIP 36 are in conductive engagement with printed circuit board 35, being peripherally surrounded by solder 38.

In order to remove DIP 36 from printed circuit board 35, solder pot 20 of the present invention is first heated in a conventional manner well known in the art until solder 38 contained in solder tubs 25 has reached the desired temperature. Solder pot 20 of the present invention and printed circuit board 35 are then placed in operating engagement with pins 37 of DIP 36 being positioned in solder 38 contained in tub 25 of channel 30, while pins 39 of DIP 36 are positioned in solder 38 of tub 25 in channel 31.

As clearly shown in FIGS. 3 and 4, heat insulating member 22 is the only component part of solder pot 20 which comes into direct contact with printed circuit board 35. Since heat insulating member 22 comprises material which prevents the conduction of heat, the heat from solder pot 20 does not affect printed circuit board 35. In this way, scoring, burning, measling, or other material degradation of printed circuit board 35 is prevented.

With pins 37 and 39 immersed in molten solder 38 of heated head 21, pins 37 and 39 are conductively heated by the molten solder contained in solder tubs 25. As the temperature of pins 37 and 39 rises, solder 38 securing pins 37 and 39 to printed circuit board 35 also become molten, thereby allowing DIP 36 to be easily removed.

Once DIP 36 has been desoldered and removed, a replacement DIP is inserted into printed circuit board 35, in the appropriate position, with the pins 37 and 39 extended through printed circuit board 35 and positioned in the molten solder 38 contained in tubs 25 of solder pot 20. Once pins 37 and 39 of the replacement DIP 36 have been heated to the appropriate temperature, solder from tubs 25 extends up pins 37 and 39 by capillary action, which solder solidifies to mount replacement DIP 36 securely in its desired position. Once DIP 36 has been soldered to printed circuit board 35, circuit board 35 with its replacement DIP 36 securely positioned thereon is ready for use.

FIGS. 6 and 7 illustrate the serious problem encountered with conventional prior art "solder-sucker" devices, which melt and draw off solder from the plated hole 51 of PC board 35. The resilient splayed orientation of DIP terminal pins 39 brings them into contact with the inside upper rim and the outside lower rim of plated hole 51. When melted solder is "sucked" from hole 51, solder remnants 52 inevitably remain at these points, as shown in FIG. 6. Upward withdrawal of DIP 36, as shown in FIG. 7, often tears these solder remnants 52 and the adjacent wall plating 53 from hole 51, damaging PC board 35 beyond repair. Such damage is totally avoided with the present invention.

It will thus be seen that the objects set forth above, among those made apparent from the preceding description, are efficiently attained and, since certain changes may be made in the above product without departing from the scope of the invention, it is intended that all matter contained in the above description or shown in the accompanying drawings shall be interpreted as illustrative and not in a limiting sense.

It is also to be understood that the following claims are intended to cover all of the generic and specific features herein described, and all statements of the scope of the invention which, as a matter of language, might be said to fall therebetween.

Having described my invention, what I claim as new and desire to secure by Letters Patent is:

1. A solder pot for removing and replacing multi-pinned components mounted on printed circuit boards, said solder pot comprising:
   A. a heat conducting head having a plurality of faces formed in its outer peripheral surface, with each of said faces having at least one elongated, longitudinally extending solder retaining recess formed therein with said recess having an overall length providing cooperative engagement with the ends of the pins of a multi-pinned component extending from the underside of the printed circuit board;
   B. heating means cooperatively associated with the heat conducting head for controllably heating the head to any desired temperature; and
   C. circuit board-supporting spacer means
      a. mounted to the heat conducting head in cooperating association with at least one face-defining plane of said multi-faced heat conducting head, and
      b. incorporating terminating upper rim edges defining a second plane in juxtaposed, spaced, substantially parallel relationship to said face-defining plane, whereby a solder pot is achieved having a plurality of faces for removing and replacing different multi-pinned components while also preventing contact of the printed circuit board with the heated head.

2. The solder pot defined in claim 1, wherein said spacer means is further defined as comprising two independent heat insulating members respectively mounted at opposed ends of an upwardly exposed one of said faces and extending therefrom, having rim edges defining therebetween a second plane above and in juxtaposed, spaced, substantially parallel relationship to the plane defined by said upwardly exposed face of said heat conducting head.

3. The solder pot defined in claim 2, wherein the multi-faced heat conducting head comprises four faces spaced about the outer peripheral surface at substantially 90° to each other.

4. The solder pot defined in claim 3, wherein said head comprises two substantially flat end surfaces and said spacer means comprises two sheets of heat insulating material, each of said sheets
   1. incorporating overall dimensions substantially matching the overall dimensions of the substantially flat end surfaces of the heat conducting head, and
   2. mounted to the substantially flat end surfaces of said heat conducting head,
thereby providing a sheet of heat insulating material on each of said substantially flat end surfaces which material protrudingly expands when heated to have ends thereof defining a plane spaced above and in juxtaposed relationship to each of said faces.

5. The solder pot defined in claim 4, wherein the solder retaining recesses formed in each of said faces comprise two elongated parallel side by side channels extending substantially the entire length of each face of said heat conducting head, with said channels being spaced apart a distance equal to the distance between the pins of a particular multi-pinned, dual-in-line component.

6. The solder pot defined in claim 5, wherein said heat conducting head is fabricated by standard extrusion techniques.

7. The solder pot defined in claim 6, wherein said heat conducting head comprises aluminum.

8. The solder pot defined in claim 5, wherein each of said elongated channels incorporates a solder tub made of iron mounted therein for securely retaining and holding molten solder, whereby diffusion of material from the solder pot into the solder is prevented.

9. The solder pot defined in claim 4, wherein said sheets of heat insulating material comprise "Teflon" fluorocarbon resin.

* * * * *